United States Patent [19]

Tasma

[11] Patent Number: 5,049,827

[45] Date of Patent: Sep. 17, 1991

[54] NON-CONTACTING POTENTIOMETER

[75] Inventor: James D. Tasma, Grand Rapids, Mich.

[73] Assignee: Jet Electronics & Technology Inc., Grand Rapids, Mich.

[21] Appl. No.: 464,238

[22] Filed: Jan. 12, 1990

[51] Int. Cl.[5] .............................................. G01R 27/08

[52] U.S. Cl. .................................... 324/723; 323/298; 323/354; 324/714; 338/334

[58] Field of Search ............... 324/660, 725, 662, 658, 324/679, 680, 686, 690, 714, 723; 323/353, 354, 298; 338/173, 334, 178

[56] References Cited

U.S. PATENT DOCUMENTS

| | | | |
|---|---|---|---|
| 3,071,758 | 1/1963 | Wolfendale | 324/660 |
| 3,296,522 | 1/1967 | Wolfendale | 324/660 X |
| 3,479,588 | 11/1969 | Makow | 324/660 |
| 3,593,115 | 7/1971 | Dym et al. | 324/660 X |
| 3,859,617 | 1/1975 | Oka et al. | 338/15 |
| 3,924,177 | 12/1975 | Lemineur et al. | 324/725 |
| 3,988,710 | 10/1976 | Sidor et al. | 338/32 |
| 4,130,796 | 12/1978 | Shum | 324/61 |
| 4,206,401 | 6/1980 | Meyer | 324/662 |
| 4,290,065 | 9/1981 | Gleason | 324/662 X |
| 4,352,465 | 10/1982 | Grechanlisky et al. | 242/7.12 |
| 4,434,391 | 2/1984 | Swartz et al. | 324/660 X |
| 4,788,384 | 11/1988 | Bruere-Dawson et al. | 178/18 |

*Primary Examiner*—Kenneth A. Wieder
*Assistant Examiner*—Robert W. Mueller
*Attorney, Agent, or Firm*—Price, Heneveld, Cooper DeWitt & Litton

[57] ABSTRACT

A non-contacting potentiometer includes a resistor and a movable probe which capacitively couples AC signals applied to the resistor to an output terminal. A closed loop control circuit is coupled to the resistor and the probe to compensate for variations in gap spacing between the probe and resistor.

24 Claims, 2 Drawing Sheets

NON-CONTACTING POTENTIOMETER

BACKGROUND OF THE INVENTION

The present invention pertains to an electrical circuit and particularly to a circuit including a non-contacting potentiometer for providing a control signal which is proportional to the position of a detecting probe with respect to a voltage dividing impedance element Potentiometers are typically employed for providing a control voltage or signal which varies with respect to the position of a rotary shaft to which a wiper arm is attached and which slides along a resistive element The resistive element may be a wire wound resistor or a thick-film surface formed resistor or other form of resistor capable of physical contact with the wiper arm. Although such potentiometers work well in most environments, over a period of time, their use results in some degradation of performance due to wear of the moveable element, contact surface resistance variations due to wear and/or dirt or other surface contaminants or even eventual failure. In critical applications where the position of a rotary shaft provides, for example, a vehicle control signal and where a conventional potentiometer is employed, it must be frequently inspected, maintained or even replaced.

In recent years some attempts have been made to provide a non-contacting potentiometer which eliminates the problem of surface contact resistance variations between the wiper arm and resistive element of a conventional potentiometer. Approaches have employed optical and magnetic systems for providing signals representative of the movement of one element with respect to the other, however, such systems are somewhat complicated in that they require a relatively unique sensing element which would be costly to mass produce and do not rely upon a voltage divider network to provide a control signal.

SUMMARY OF THE PRESENT INVENTION

The system of the present invention provides a non-contacting potentiometer which in a preferred embodiment employs an impedance such as a resistive element to which an activating AC voltage is applied and which includes a detecting probe positioned in spaced relationship to the resistive element and moveable between opposite ends of the resistive element to provide a control signal at the detecting probe by virtue of capacitive coupling of an AC signal from the resistive element to the detecting probe. Such a non-contacting potentiometer can be constructed employing a conventional wire wound potentiometer resistive element and with a wiper arm modified to be positioned in a non-contacting but moveable relationship with respect to the resistive element In a preferred embodiment of the present 20 invention, any variations of the spacing between the detecting probe and the surface of the resistor is compensated for by controlling the voltage to the resistance to maintain the detecting probe at a predetermined level regardless of its position and detecting the control voltage applied to the resistor to achieve such result. The resultant signal represents the relative position of the probe with respect to the resistance element and therefore the position of the detecting probe which can be employed for any number of applications including the position of a rotary shaft for example.

Thus the system of the present invention provides a non-contacting potentiometer which can be relatively inexpensively manufactured using substantially existing potentiometer components with slight modifications and provides a non-contacting potentiometer which is extremely accurate and not subject to wear or degradation of performance due to wear, dirt or other contaminates. These and other features, objects and advantages of the present invention, will become apparent to those skilled in the art upon reading the description thereof together with reference to the drawings in which.

DETAILED DESCRIPTION OF THE PREFERRED EMBODIMENT

Figure 1:
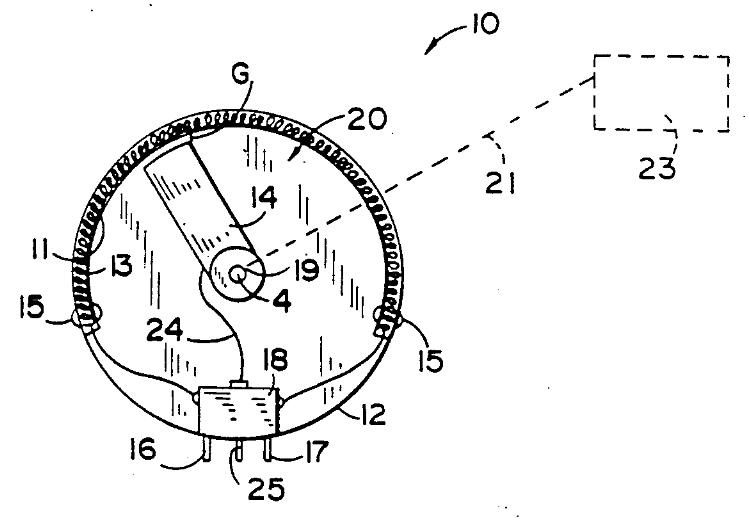
FIG. 1 is a front elevational view of a broken away motion dectector including a resistive element which is employed with the invention.

Referring initially to FIG. 1 there is shown a motion detector comprising a non-contacting potentiometer 10 shown with its cover removed and which is used with the present invention. The detector can constitute a conventional wire wound resistive potentiometer 12 with a modified wiper arm 14 defining in the present invention a detecting probe 20. The potentiometer 10 includes a 10 K ohm wire wound resistor 11 wound on an arcuately bend flat insulated substrate 13 secured to housing 12, such as by rivets 15 at opposite ends thereof, in a conventional manner. Opposite ends of the wire wound resistance element 11 are coupled to electrical terminals 16 and 17 through a suitable terminal block 18. A rotary shaft 19 is coupled as illustrated by phantom line 21 to a device 23 the movement of which is desired to be detected and for which a control signal representing movement of the device is provided by the present invention. Element 23 can be any number of devices physically coupled to shaft 19. Shaft 19 is coupled to a detecting probe 14 which constitutes an electrically conductive member extending from the axis of rotation of shaft 19 outwardly toward the wire wound resistor 11, but in spaced relationship thereto, as indicated by the gap "G" shown in FIG. 1, such that outer conductive edge of the probe 14 does not come into physical contact with the wire wound resistor 11 but maintains a substantially constant gap as the shaft 19 rotates between the extreme end positions of the resistor In the preferred embodiment the gap was selected to be approximately 0.001 inches and was relatively uniform with the motion of the shaft 19.

The probe constituting moveable element 14 is coupled to an output terminal 25 by means of a suitable electrical conductor 24. With the potentiometer shown in FIG. 1 it can be seen that if a relatively high frequency alternating current (AC) voltage is applied between input terminals 16 and 17 representing the opposite ends of the resistor, an AC voltage detecting circuit can be coupled to terminal 25 and terminal 16 and/or 17 and the voltage capacitively coupled from the end of probe 14 and the surface of resistance 11 will vary as a function of the rotary position of shaft 19. Thus a non-contacting potentiometer incorporating a capacitive pick-up probe is provided which is relatively inexpensive to manufacture by the substitution of an existing wiper arm with a detecting probe 14 as illustrated in FIG. 1.

In critical applications of the non-contacting potentiometer of the present invention, however, the gap "G" will vary somewhat as shaft 19 moves with respect to resistance element 11 Inasmuch as the capacitance between the end of probe 14 and the resistive element 11 varies in inverse relationship to the size of gap "G", the capacitive coupling and therefore the signal voltage at terminal 25 will also vary with respect to the gap and therefore the output signal may not accurately represent the position of detecting probe 14 with respect to the resistance element 11 in such critical applications. Although an extremely accurate potentiometer can be manufactured employing capacitive coupling, the cost of manufacturing such a device to control the gap spacing to a critical tolerance could be prohibitive. As a result, the circuitry shown in FIGS. 2 and 3 is employed in connection with the detector shown in FIG. 1 to provide an inexpensive and extremely accurate control signal as a result of the movement of the detecting probe 14 with respect to the resistive element 11.

Figure 2:
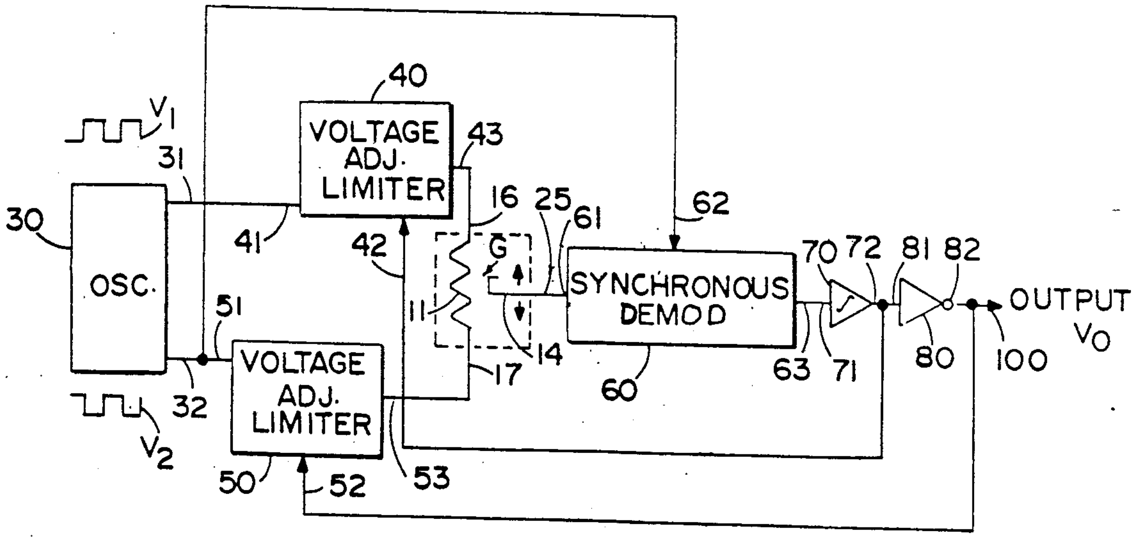
FIG. 2 is an electrical circuit diagram in block form of a circuit in connection with the detector shown in FIG. 1.
Figure 3:
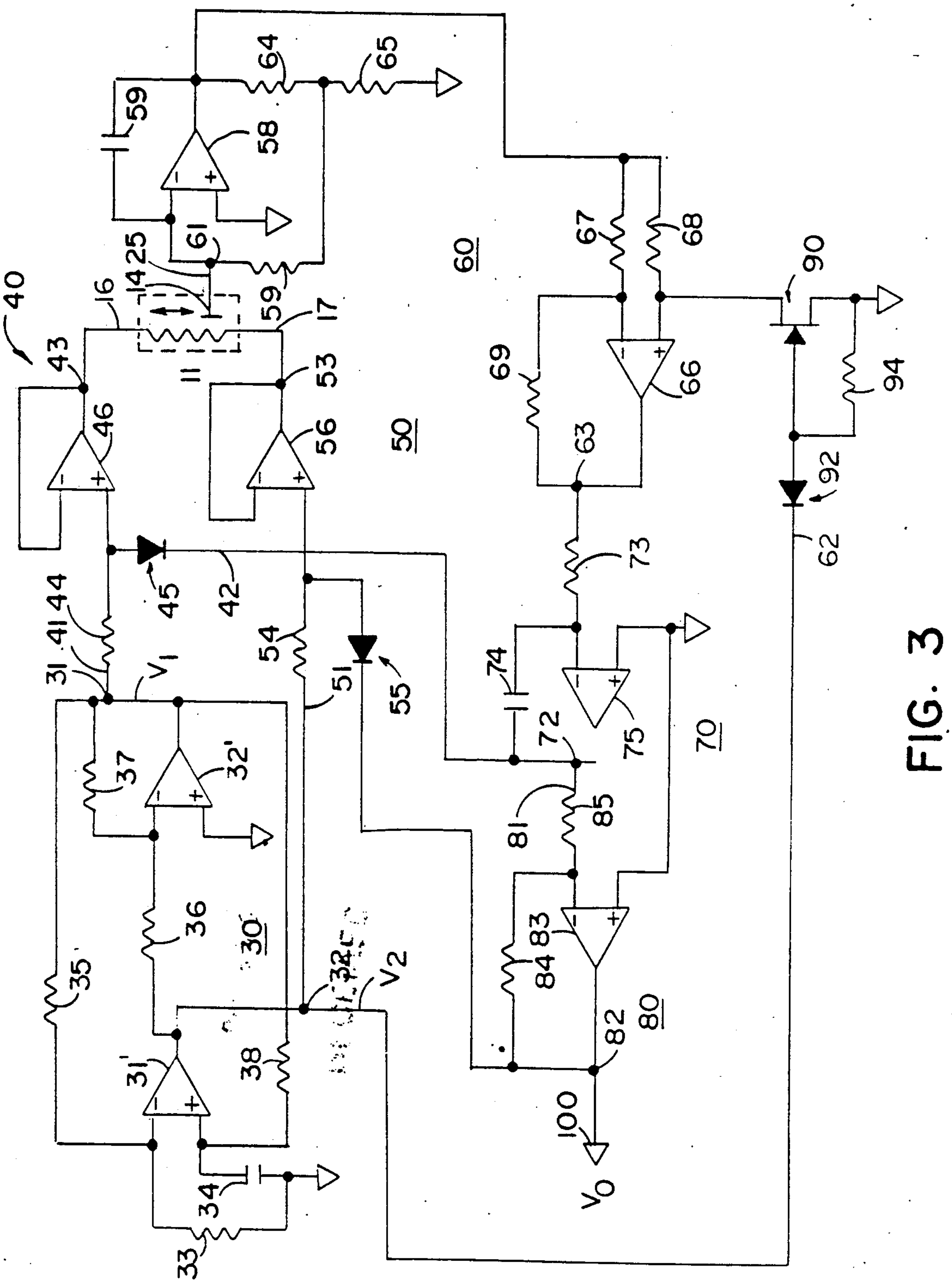
FIG. 3 is an electrical circuit diagram in schematic form of the circuit shown in FIG. 2.

Referring now to FIG. 2, there is shown a block diagram of the circuit and potentiometer embodying the present invention. Reference numerals common to FIGS. 1, 2 and 3, refer to the same circuit elements. The basic concept involved in the circuit shown in FIG. 2 is to drive opposite ends of the resistive element 11 with an out-of-phase voltage the amplitude of which is selectively controlled to maintain the output voltage at terminal 25 of the capacitive probe 14 at zero voltage level using a closed loop control circuit The voltage necessary to maintain the probe at such a null level will vary only as a function of the position of the moveable element with respect of one end or the other of the resistive element 11 and not as a function of variations in the gap "G". Thus by controlling the amplitude and phase of the voltage applied to the resistance element to maintain the voltage at the detecting probe at 0, the effects of capacitance variations is eliminated.

Referring initially to FIG. 2, a circuit to accomplish this goal is shown and includes a 20 KHz oscillator 30 providing a first voltage $V_1$ and a second output voltage $V_2$ at output terminals 31 and 32 respectively. These signals are applied to the input 41 of a first voltage adjustable limiter circuit 40 and input 51 of a second voltage adjustable limiter circuit 50 respectively. Limiters also include control voltage input terminals 42 and 52 respectively and output terminals 43 and 53 respectively which are coupled to input terminals 16 and 17 respectively of the resistive element 11. As can be seen in FIG. 2, the voltages $V_1$ and $V_2$ are substantially square wave signals of opposite phase (i.e. 180° out-of-phase). If the probe 14 was centered with respect to the resistive element 11 (i.e. at the mid-point), it can be seen that the voltage at such point would be 0, assuming the limiters 40 and 50 provided the same gain to signals $V_1$ and $V_2$. This would be true regardless of this spacing of gap "G" due to the unbalanced driving of the resistive element 11. As probe 14 moves either upwardly as shown in FIG. 2, the voltage at terminal 25 would become positive and as it moves downwardly, the voltage would become negative without the control circuit shown in FIG. 2. Such a voltage may not accurately represent the position of the probe with respect to resistive element 11 due to gap variations. By providing a closed loop feedback control, which maintains the voltage at terminal 25 at 0, however, gap-dependant variations will be eliminated and an output voltage $V_0$ provided at output terminal 100 which accurately represents the position of probe 14 with respect to resistive element 11.

For such purpose, the output terminal 25 of potentiometer 10 is coupled to the input of a synchronous demodulator circuit 60 which also receives $V_2$ to synchronize its operation with oscillator 30. The output voltage from synchronous demodular 60 is applied first to an integrator circuit 70 at input terminal 71 thereof and having output terminal 72. Output terminal 72 is coupled to input terminal 42 of the voltage adjustable limiter circuit 40 and to input terminal 81 of an inverter circuit 80 having its output terminal 82 coupled to output terminal 100 of the circuit as well as to input terminal 2 of the voltage adjustable limiter 50.

The signals at terminals 72 and 82 are employed to control the amplitude of voltages $V_1$ and $V_2$ as a function of the synchronous detected voltage at terminal 25 which tends to raise or lower and which is driven back to 0 by the closed loop control signals from terminals 72 and 82 through adjustable limiters 40 and 50. The control signals at terminals 72 or 82 are DC varying signals, the amplitude of which accurately represents the position of probe 14 with respect to resistive element 11 regardless of the gap spacing "G". The detailed construction and operation of the circuit shown in FIG. 2 is now presented in connection with FIG. 3. It is to be understood in reference to FIG. 3 that the various operational amplifiers and circuit elements therein are typically mounted on a single integrated circuit chip and power is conventionally supplied to them which specific power connection is not specifically shown in the figure.

Oscillator 30 is a conventional R-C oscillator made of first amplifier 31', a second amplifier 32' with a resistor 33 and a capacitor 34 coupled to the negative and positive input terminals of amplifier 31' as illustrated. Feedback resistor 35 couples the negative input terminal of amplifier 31' with the output of amplifier 32' while the output of amplifier 31' is coupled to the negative input of amplifier 32' by resistor 36. An output feedback resistor 37 couples the output of amplifier 32' with its negative input while resistor 38 couples the output of amplifier 32' with the positive input of amplifier 31'. The selection of the value of the capacitor C1 and resistive elements determine the frequency of operation of the R-C oscillator 30 which in the preferred embodiment is selected to be approximately 20 KHz. This square wave signal is a first phase $V_1$ at output terminal 31 and at an opposite phase as $V_2$ at output terminal 32.

Voltage $V_1$ is applied through resistor 44 to a first limiter circuit 40 which comprises a limiting diode 45 having its anode coupled to the positive input terminal of operational amplifier 46 and its cathode coupled to output terminal 72 of integrator circuit 70. The signal at output terminal 43 of the non-inverting unity gain operational amplifier 46 therefore will have its level controlled by the oscillator input signal $V_1$ as well as the conductive level of clamping diode 45 which limits the positive excursion of the voltage $V_1$.

Similarly, voltage $V_2$ is applied through resistor 54 to an operational amplifier 56 of the voltage adjustable limiter 50 having the anode of a clamping diode 55 coupled to its positive input terminal with the cathode of diode 55 coupled to output terminal 82 of inverter 80. The output terminal 43 of amplifier 46 is coupled to terminal 16 of detector 10 while terminal 53 of operational amplifier 56 is coupled to input terminal 17 of detector 10. Each of the operational amplifiers 46 and 56 are unity gain non-inverting amplifiers. As will be explained in greater detail below, the voltage applied to input terminals 16 and 17 of resistance element 11 is varied in amplitude and can be varied in phase to provide a null output at output terminal 25 of the potentiometer detector probe 14.

Terminal 25 is coupled to input terminal 61 of the synchronous demodulator 60 which includes an input operational amplifier 58 with a capacitor 59 feedback coupled between its output and negative input terminal to serve as a charge amplifier. Biasing resistors 59, 64 and 65 are also coupled to the amplifier as shown. Amplifier 58 provides an inverted AC output signal as potentiometer detecting element 14 is first moved from a preexisting null condition. This AC signal is applied to a second operational amplifier 66 coupled as a differential amplifier. The AC signal is applied to the negative input terminal of amplifier 66 through resistance 67 and to the positive input terminal through resistance 68. A feedback resistor 69 couples the output of amplifier 66 to its negative input terminal while the voltage $V_2$ from oscillator 30 is coupled to the cathode of diode 92. The anode of diode 92 is coupled to the gate of FET 90 and to bias resistor 94. The source of FET 90 is coupled to ground and drain is coupled to the positive input of amplifier 66.

The demodulator circuit 60 is activated to amplify the applied signal from terminal 25 such that if the voltage on the output of amplifier 58 is in-phase with voltage $V_2$, a negative voltage will appear at the output of amplifier 66. If the output, on the other hand, of voltage from the amplifier 58 is out-of-phase with voltage $V_2$, then a positive output voltage appears at the output of amplifier 66 and therefore at the output terminal of the demodulator circuit 60. The R-C integrator circuit, including resistor 73 and capacitor coupled to an operational amplifier 75 forming integrator 70 integrates the positive or negative going pulses from synchronous demodulator 60 providing a varying level DC voltage DC output signal at output terminal 72 which is inverted by amplifier 83 in inverter circuit 80 which also includes an input resistor 85 and a feedback resistor 84. The output of inverter 80 is coupled to the cathode of clamping diode 55 while the output of the integrator 70 is coupled to the cathode of clamping diode 45 to provide a DC varying reference voltage which shifts the amplitude level of voltage applied to input terminals 16 and 17 of resistance 11 in synchronism with the applied signal from oscillator 30 to drive the output terminal 25 to its null voltage. The DC varying voltage at output terminal 82 is applied to the systems output terminal 100 to provide a DC voltage level which therefore represents the position of element 14 with respect to the resistive element 11. As element 14 moves up for example, it would tend to pick-up a positive AC signal from resistive element 11 which would be in-phase with voltage $V_1$. The result is a negative going signal from demodulator 60 which is inverted by integrator 70 to reduce the voltage at terminal 16 driving the positive going signal at terminal 25 back to 0. The converse is true as the probe 14 moves in a downward direction or toward terminal 17, thereby maintaining the output voltage at terminal 25 at 0. Since the amplitude of the voltage detected by probe 14 from terminals 16 and 17 are the same with respect to one another regardless of the gap "G" and between the probe and the resistive element, gap variations do not effect the voltage level at output 100, which is dependant only upon the relative position of the probe between terminals 16 and 17. As a result, an extremely accurate non-contacting potentiometer is provided which can be relatively inexpensively constructed utilizing conventional integrated circuits and a modified conventional potentiometer to provide a capacitive pick-up probe.

It will become apparent to those skilled in the art that various modifications to the preferred embodiment of the invention as described herein can be made without departing from the spirit or scope thereof as defined by the appended claims.

The embodiments of the invention in which an exclusive property or privilege is claimed are defined as follows.

1. A non-contacting potentiometer comprising:

an impedance element formed to extend along a predetermined physical path and having terminals at opposite ends thereof;

means for applying an AC activating signal to said terminals;

a movable probe mounted to extend in spaced relationship to said impedance element, said probe moving along said path and sensing the signal level at various locations along said impedance element; and circuit means coupled to said movable probe, said circuit means receiving the signal level on said probe for providing an output signal representative of the movement of said probe.

2. The potentiometer as defined in claim 1 wherein said impedance element is a resistor and said probe is capacitively coupled to said resistor.

3. The potentiometer as defined in claim 2 wherein said circuit means includes a closed loop control circuit coupled to said terminals and to said probe for varying the activating signal to maintain the voltage at said probe at a null level as said probe moves along said resistor.

4. The potentiometer as defined in claim 3 wherein said means for providing an activating signal to said terminals comprises an oscillator for providing opposite phase AC signals to said terminals.

5. The potentiometer as defined in claim 4 wherein said control circuit includes adjustable voltage limiting means coupled to each of said terminals and demodulator means coupled to said probe and to said limiting means in a closed loop circuit.

6. The potentiometer as defined in claim 5 wherein said demodulator is a synchronous demodulator coupled to said oscillator to receive a synchronizing signal therefrom.

7. The potentiometer as defined in claim 1 wherein said impedance element is a rotary potentiometer having a resistor and wherein said probe is a wiper arm of said potentiometer which is formed to remain in non-contacting spaced relationship to said resistor.

8. The non-contacting potentiometer as defined in claim 1, wherein said means for applying an AC activating signal to said terminals applies first and second signals to said terminals, said means for applying including means for generating third and fourth signals and means responsive to fifth and sixth signals for adjusting said third and fourth signals for outputting said first and second second signals; and wherein said circuit means generates said fifth and sixth signals.

9. The potentiometer as defined in claim 1, wherein said circuit means controls said AC activating signal applied to said terminals responsive to the signal level on said probe.

10. A motion detecting system for providing an electrical control signal representative of the position of a body comprising:

a detector including an impedance element with a predetermined length and a movable probe adapted to be coupled to a body and mounted in spaced relationship to said impedance element and movable along said impedance element; and circuit means coupled to said impedance element for providing an AC signal to said impedance element which is capacitively coupled to said probe, said circuit means connected to said probe to receive a signal level on said probe, whereby said circuit means provides an output signal having an amplitude which represents the position of said probe.

11. The system as defined in claim 10 wherein said impedance element is a resistor with terminals at opposite ends thereof.

12. The system as defined in claim 11 wherein said circuit means includes an oscillator for providing opposite phase activating signals to opposite ends of said resistor.

13. A non-contacting potentiometer comprising:

a potentiometer including a resistor and a rotary shaft having a probe mounted thereto which extends toward said resistor and in spaced relationship thereto said resistor including terminals at opposite ends thereof;

means for applying AC activating signals of opposite phases to said terminals; and circuit means coupled to said terminals and said probe for providing an output signal representative of the rotation of said shaft.

14. The potentiometer as defined in claim 13 wherein said circuit means includes a closed loop control circuit coupled to said terminals and to said probe for varying said activating signals to maintain the voltage at said probe at a null level as said probe moves along said resistor.

15. The potentiometer as defined in claim 14 wherein said means for providing AC activating signals to said terminals comprises an oscillator.

16. The potentiometer as defined in claim 15 wherein said control circuit includes adjustable voltage limiting means coupled to each of said terminals and demodulator means coupled to said probe and to said limiting means in a closed loop circuit.

17. The potentiometer as defined in claim 16 wherein said demodulator is a synchronous demodulator coupled to said oscillator to receive a synchronizing signal therefrom.

18. The potentiometer as defined in claim 13, wherein said circuit means controls said AC activating signal applied to said terminals responsive to the signal level on said probe.

19. A non-contacting potentiometer comprising:

a potentiometer including a resistor and a rotary shaft having a probe mounted thereto which extends toward said resistor and in spaced relationship thereto, said resistor including a first terminal at one end and a second terminal at the opposite end thereof;

circuit means connected to said first and second terminals and said probe, said circuit means including means for generating first and second AC activating signals of opposite phases, and means for applying said first and second activating signals to said first and second terminals, respectively, said circuit means responsive to the signal level on said probe for providing an output signal representative of the rotation of said shaft and for adjusting said first and second AC activating signals applied to said first and second terminals as said probe moves along said resistor.

20. A non-contacting potentiometer comprising:

an impedance element and a movable probe in spaced relationship thereto, said impedance element including terminals at opposite ends thereof;

means for applying AC activating signals to said terminals; and circuit means coupled to said means for applying AC signals and said probe for providing an output signal representative of the movement of said probe, wherein said circuit means and said means for applying said AC activating signals provide a closed loop control circuit coupled to said terminals and to said probe and said activating signals supplied to said terminals are adjusted responsive to movement of said probe.

21. The system as defined in claim 20 wherein said control circuit includes adjustable voltage limiting means coupled to each of said terminals and demodulator means coupled to said probe and to said limiting means in a closed loop circuit.

22. The system as defined in claim 21 wherein said demodulator is a synchronous demodulator coupled to said oscillator to receive a synchronizing signal therefrom.

23. The system as defined in claim 22 wherein said resistor is a wire wound resistor mounted in a rotary potentiometer.

24. The system as defined in claim 23 wherein said probe is a wiper arm of said potentiometer which is formed to move in spaced non-contacting closely adjacent relationship to said resistor.

* * * * *

UNITED STATES PATENT AND TRADEMARK OFFICE
CERTIFICATE OF CORRECTION

PATENT NO. : 5,049,827

DATED : September 17, 1991

INVENTOR(S) : James D. Tasma

It is certified that error appears in the above-identified patent and that said Letters Patent is hereby corrected as shown below:

Column 1, line 14:
After "element" insert --.--;

Column 1, line 57:
Before "invention" delete --20--;

Column 2, line 10:
After "the" insert --following--;

Column 2, line 16:
After "circuit" insert --employed--;

Column 2, line 51:
After "resistor" insert --.--;

Column 3, line 6:
After "element 11" insert --.--;

UNITED STATES PATENT AND TRADEMARK OFFICE
CERTIFICATE OF CORRECTION

PATENT NO. : 5,049,827

DATED : September 17, 1991

INVENTOR(S) : James D. Tasma

It is certified that error appears in the above-identified patent and that said Letters Patent is hereby corrected as shown below:

Column 3, line 32:
After "circuit" insert --.--;

Column 4, line 16:
"2" should be --52--;

Column 6, claim 8, line 66:
Delete "second" second occurrence.

Signed and Sealed this

Twenty-fourth Day of August, 1993

Attest:

Bruce Lehman

BRUCE LEHMAN

*Attesting Officer*

*Commissioner of Patents and Trademarks*